(12) United States Patent
Hsu

(10) Patent No.: US 6,407,607 B1
(45) Date of Patent: Jun. 18, 2002

(54) IN AND OUT OF PHASE SIGNAL GENERATING CIRCUIT

(75) Inventor: Hsin-Kun Hsu, Kaohsiung (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/727,870

(22) Filed: Dec. 4, 2000

(51) Int. Cl.[7] .............................................. H01L 27/04
(52) U.S. Cl. ........................ 327/284; 327/297; 327/261
(58) Field of Search ................................. 327/261, 284, 327/263, 297, 564, 565

(56) References Cited

U.S. PATENT DOCUMENTS

| | | | |
|---|---|---|---|
| 4,392,105 A | 7/1983 | McLeod | 324/57 DE |
| 4,876,501 A | 10/1989 | Ardini et al. | 324/73 R |
| 5,761,081 A | 6/1998 | Tomita et al. | 364/490 |
| 5,923,676 A | 7/1999 | Sunter et al. | 371/22.5 |
| 6,005,829 A | 12/1999 | Conn | 368/118 |
| 6,263,483 B1 * | 7/2001 | Dupenloup | 716/18 |

FOREIGN PATENT DOCUMENTS

JP          0124429 A   * 12/1998

* cited by examiner

*Primary Examiner*—Dinh T. Le
(74) *Attorney, Agent, or Firm*—George O. Saile; Stephen B. Ackerman (57) ABSTRACT

In the present invention a signal generator is described for use in measuring the effects of wire to wire coupling in integrated circuits. A signal is connected to a wire that is surrounded by reference wires. A set of latches are used to set up and initiate signals simultaneously on the reference wires and the signal wire. Using latch reset and preset in phase and out of phase signals are created on the reference and signal wires that are routed in parallel. Several stages can be concatenated together in series to produce a delay resulting from coupling that can be easily measure. The latches at the beginning of each stage are activated by an enable signal to keep the signals in the reference wires and the signal wire synchronized.

20 Claims, 5 Drawing Sheets

| Mode | Phase | Transition | D1 | In1 | In2 | Preset to 1 | Reset |
|------|-------|------------|-----|-----|-----|-------------|-------|
| 1 | In | 0→1 | 1 | 1 | 1 | | Latch S,1,2 |
| 2 | In | 1→0 | 0 | 0 | 0 | Latch S,1,2 | |
| 3 | Out | 0→1 | 1 | 0 | 0 | Latch S | Latch S |
| 4 | Out | 1→0 | 0 | 1 | 1 | Latch S | Latch 1,2 |
| 5 | Gnd | 0→1/1→0 | 1/0 | 0 | 0 | _/ Latch S | Latch S,1,2 |
| 6 | VDD | 0→1/1→0 | 1/0 | 1 | 1 | Latch 1,2 /S | Latch S |

IN AND OUT OF PHASE SIGNAL GENERATING CIRCUIT

BACKGROUND OF THE INVENTION

1. Field of Invention

The present invention refers to signal generation for the purpose of measuring delay of a signal through a network and more particular measuring wire coupling capacitance that delays a signal in an integrated circuit.

2. Description of Related Art

In deep sub-micron integrated circuits wire capacitance is dominated by coupling capacitance to adjacent wires. The adjacent wires can be either wires in the same plane that lay side beside or on different wiring planes where the coupling capacitance occurs where areas of wires lay on top of one another separated by an insulator. The coupling of signals through the coupling capacitance can cause substantial delay to a signal depending on whether the direction of switching is in the same direction or different direction.

In U.S. Pat. No. 6,005,829 (Conn) describes a method is directed to characterizing interconnect timing using a reference ring oscillator circuit. In U.S. Pat. No. 5,923,676 (Sunter et al.) describes a BIST architecture directed to the measurement of integrated circuit delays in combinatorial and sequential logic. In U.S. Pat. No. 5,761,081 (Tomita et al.) describes a method directed to evaluating signal propagation delay in an integrated inverter circuit chain. In U.S. Pat. No. 4,876,501 (Ardini et al.) describes a method and apparatus directed to accurately measure of VLSI devices with a test instrument having errors comparable to the delays being measured. In U.S. Pat. No. 4,392,105 (McLeod) describes a test circuit directed to delay measurements on an LSI chip containing two oscillating loops with one loop containing the circuit under test.

Testing for the coupling effects between wires in integrated circuits is made difficult by the length that wires run in parallel and whether the signals on the wires that are coupled by capacitance are switching in the same direction or opposite directions. Ideally, if two wires coupled by capacitance have two signals that switch at exactly the same time in the same direction and with the same amplitude, there will be no energy transfer through the coupling capacitance and there will be no observable effect on the delay of one signal upon the other. In this case the effective coupling capacitance is thought to be zero. If the same two wires have two signals which switch in opposite directions at exactly the same time, there will be a maximum transfer of energy between the two wires resulting in the increased the delay of the signals. If the amplitude of the two signals of opposite direction are equal, then the effective coupling capacitance is twice the physical capacitance. As the timing of the two signals vary from being in phase to being out of phase and the amplitude of the two signals vary, the effective coupling capacitance varies from zero to twice the physical coupling capacitance.

Figure 1:
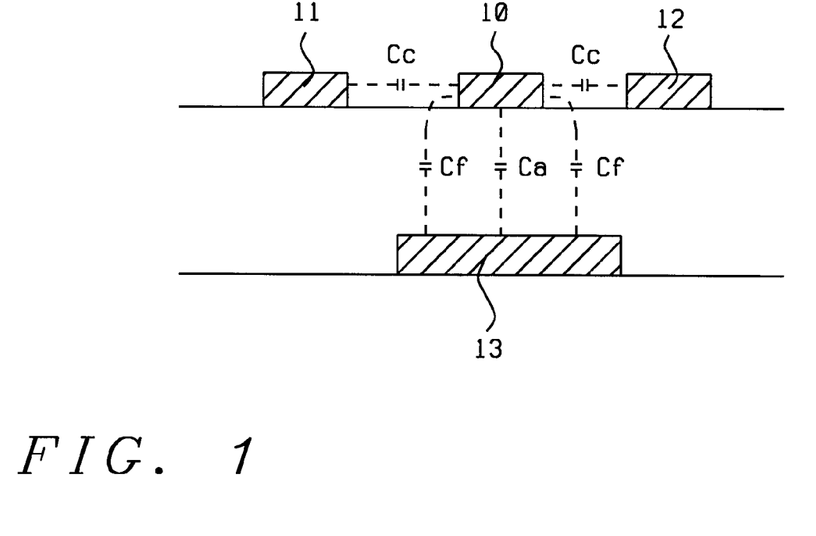
FIG. 1 is a diagram of coupling capacitance between wires in an integrated circuit, FIGS. 2a, b and c show possible layout of wires in an integrated circuit that have coupling capacitance, FIG. 3a show an implementation of a signal generator which delays a signal caused by wire to wire coupling.

In FIG. 1 is shown a wire 10 coupled to two additional wires, 11 and 12, on the same wiring plane and coupled to a third wire 13 on an adjacent wiring plane. The capacitance, Cc, is the coupling capacitance between the parallel lengths of wire running on the same wiring plane. The capacitance, Cc, is determined by the geometry of the routed wires and the dielectric located in between. The coupling capacitance, Ca, between wires on different planes is a result of the area of the two wires that are in parallel, such as the area where one wire crosses over a second wire. If one wire, 13, is larger than a second wire, 10, a fringing capacitance, Cf, may add substantially to the coupling capacitance, Ca.

Figure 2A:
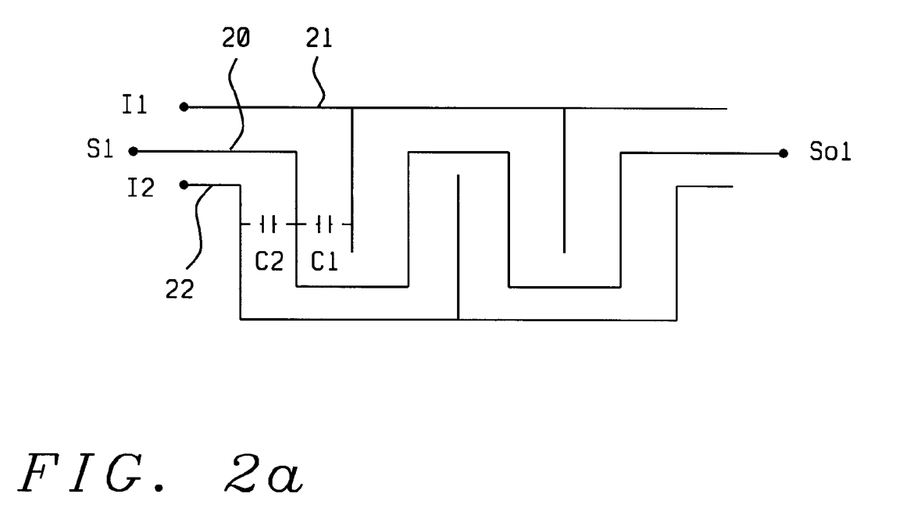
Figure 2B:
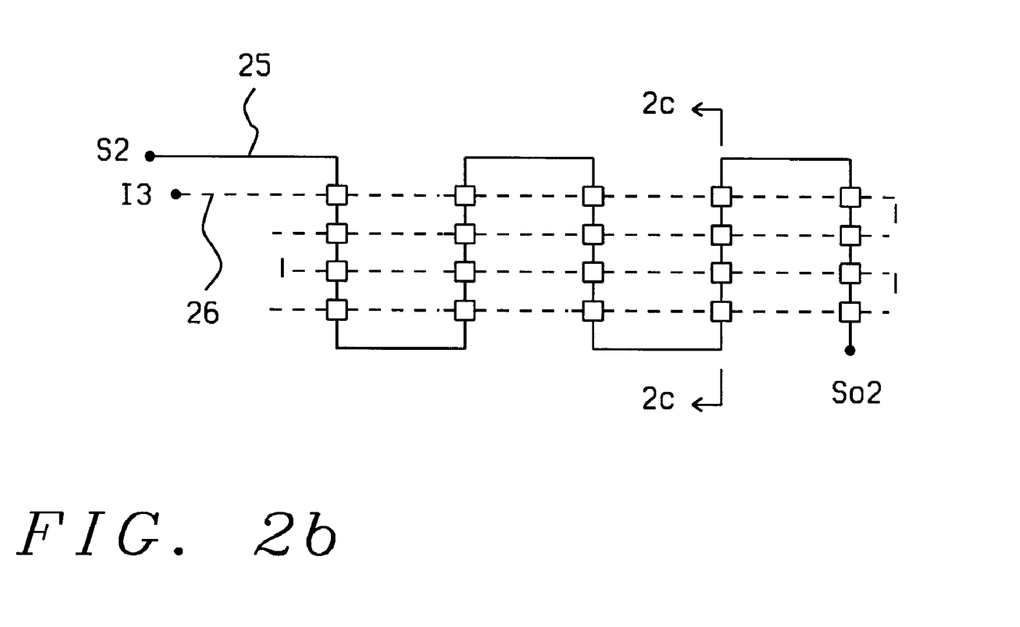
Figure 2C:
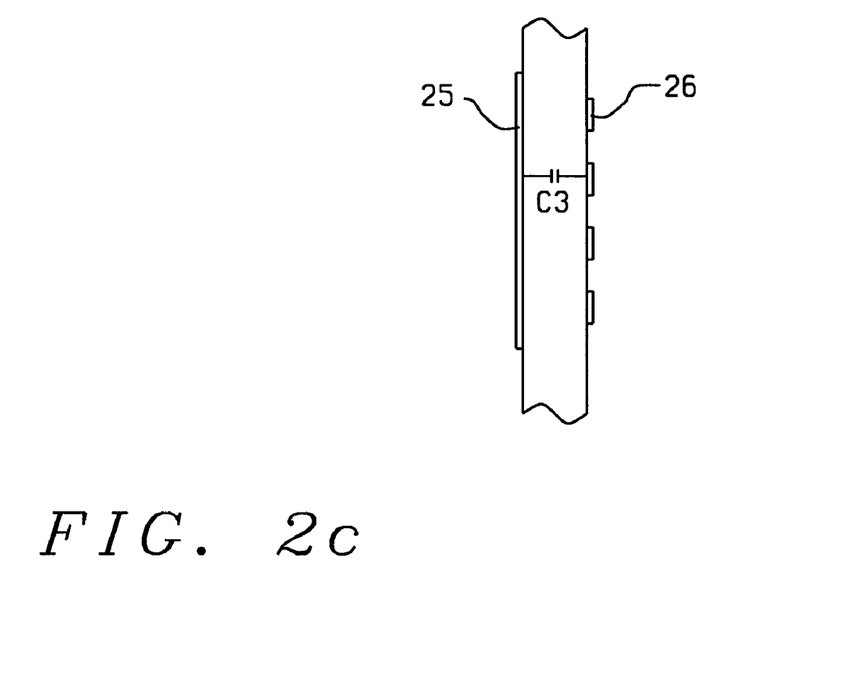

In FIG. 2a a plan view is shown of the routing of three wires on a wiring plane. A signal wire 20 is routed between and in parallel with two other wires 21 and 22. A signal S1 enters signal wire 20 at the parallel routing of the three wires and exits from the parallel combination at So1. Wires 21 and 22 have signals 11 and 12 that couple energy to the signal wire 20 through capacitance C1 and C2 and distort and slow the signal S1. In FIG. 2b is shown the plane view of two wires 25 and 26 that are routed in parallel on separate planes. Wire 26 being routed on a lower wiring plane is symbolized by the dashed lines and the area of overlap that produces the coupled capacitance is symbolized squares where the two wires are routed over one another. The capacitance C3, shown in FIG. 2c, is the capacitance of each individual area where the two wires cross each other. A summation of all the incremental capacitance represented by C3 forms the coupling capacitance between signal wire 25 and coupling wire 26. A signal S2 entering one end of wire 25 will be adversely affected by the coupling affect caused by C3 and the signal will reach the output So2 after being delayed in addition to the wire delay by the coupling capacitance.

As integrated circuits get smaller the affect of coupling on the delay of a circuit will increase. Because of all the variables it is difficult to predict how much the increased delay due to coupling is. A capability is needed to form various coupling arrangements and measure the affects of combinations of signals applied to wires that are in parallel.

SUMMARY OF THE INVENTION

An objective of the present invention is to generate a signal that has been delayed by energy coupled from adjacent parallel wires. It is further and objective of the present invention to produce delayed signals with in phase and out of phase coupling affects for both positive and negative signal transitions. It is also an objective of the present invention to produce an in phase and out of phase signal generator that is capable of being coupled to additional stages to produce a delay between an input and an output of the last stage that can be easily measured. It is further an objective of the present invention to be able to couple additional stages without the signal becoming out of phase with the test setup signals.

A first stage of a signal generating circuit for delaying in phase and out of phase signals is demonstrated. An N-stage signal generating circuit is described that is constructed from concatenating N-stages of the first stage together where the output from a stage drives the enable input of the next stage. Different modes are shown which include in phase, out of phase and quiescent coupling. The signal generating circuits are a cell-based design that can be easily implemented in CMOS technology.

BRIEF DESCRIPTION OF THE DRAWINGS

This invention will be described with reference to the accompanying drawings, wherein.

DETAILED DESCRIPTION OF THE PREFERRED EMBODIMENT

Figure 3A:
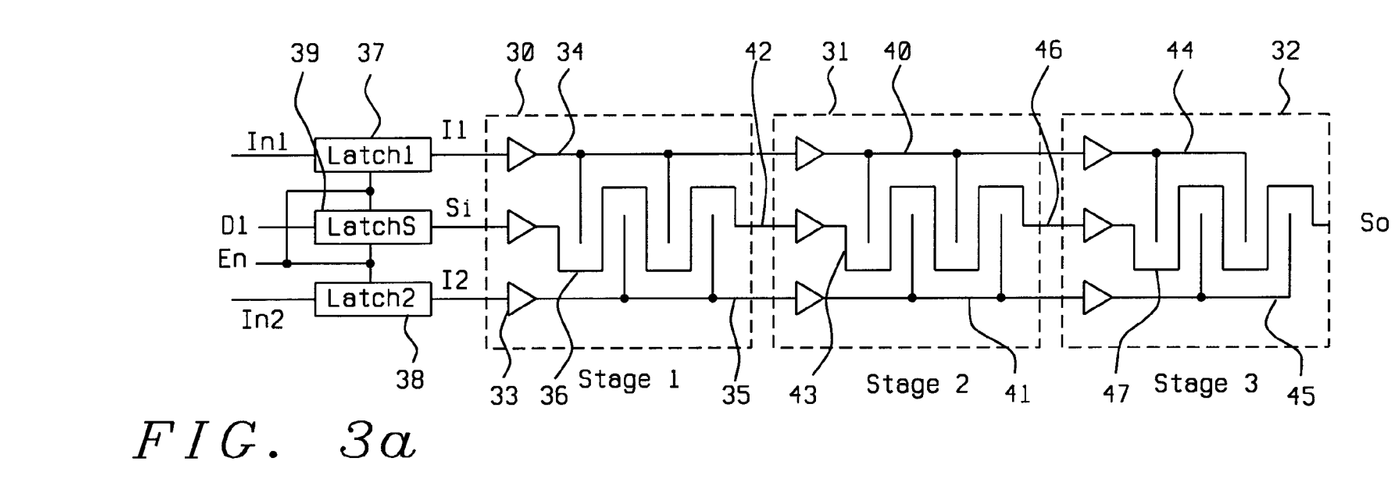

In FIG. 3a is shown a schematic diagram of a three stage signal generator of the present invention. Three stages of wiring delay 30, 31 and 32 are connected together in series with non-inverting amplifiers 33 connecting the signal from one stage to the next. Two reference signal wires 34 and 35 are routed on either side of a signal wire 36. A first latch 37 with a signal input In1 is connected to a first reference line 34 in the first stage 30 through a non-inverting amplifier 33. A second latch 38 with a signal input In2 is connected to a second reference line 35 in the first stage 30 through a non-inverting amplifier 33. A signal latch 39 with a signal input D1 is connected to the signal line 36 in the first stage 30 through a non-inverting amplifier 33. The second stage 31 is connected to the first stage 30 through non-inverting amplifiers 33. The first reference line 34 is connected to the first reference line 40 of stage 2 through a non-inverting amplifier 33, and the second reference line 35 is connected to the second reference line 41 of the second stage 31 through a non-inverting amplifier 33. The output of the signal line 42 in the first stage 30 is connected to the input of the signal line 43 of the second stage through a non-inverting amplifier 33. The third stage 32 is connected to the second stage 31 through non-inverting amplifiers 33. The first reference line 40 of the second stage is connected to the first reference line 44 of the third stage 32 through a non-inverting amplifier 33, and the second reference line 41 of the second stage 31 is connected to the second reference line 45 of the third stage 32 through a non-inverting amplifier 33. The output of the signal line 46 of the second stage 31 is connected to the input of the signal line 47 of the third stage through a non-inverting amplifier 33.

Continuing to refer to FIG. 3a, signal transitions I1, I2 and Si occur simultaneous when the enable signal En activates the latches 37, 38 and 39 and the transitions are in phase in the first stage 30. The three signals will not be in phase in the second and third stages 31 and 32 because of the layout mismatch and because there are not any timed latches in the subsequent stages to reestablish the timings between signals as there is in the first stage with latches 37, 38 and 39.

Figure 3B:
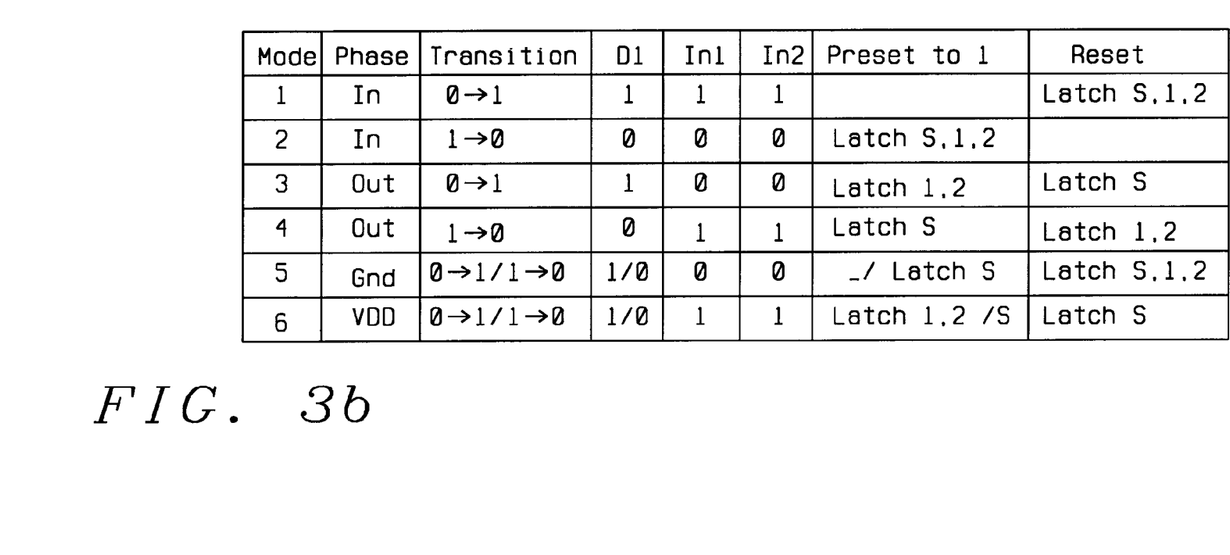
FIG. 3b is a table of different modes used to create a signal in the signal generator shown in FIG. 3a, FIG. 4a shows the preferred implementation of the signal generator of the present invention for a positive transition.

Referring to FIG. 3b, a table is shown with the conditions required for the various modes for the delay network of FIG. 3a. In mode 1 the signals I1, I2 and Si are in phase with a positive transition going from a logical "0" to a logical "1". The input signals D1, In1 and In2 to the latches are set to a logical "1", and Latch1, Latch2, and LatchS are all reset before the latch enable signal, En, is applied. When the enable signal is applied, signals I1, I2 and Si start at a logical "0" and begin to make the transition together from the logical "0" to a logical "1". This causes the instantaneous voltages on reference lines 34 and 35 and on signal line 36 to be approximately the same, resulting in very little energy being coupled to or from the signal line. Thus a minimum of added delay caused by coupling is observed. In mode 2 the signals I1, I2 and Si are in phase with a negative transition going from a logical "1" to a logical "0". The input signals D1, In1 and In2 to the latches are set to a logical "0", and Latch1, Latch2, and LatchS are all preset to a logical "1" before the latch enable signal, En, is applied. When the enable signal is applied, signals I1, I2 and Si start at a logical "1" and begin to make the transition together from the logical "1" to a logical "0". This causes the instantaneous voltages on reference lines 34 and 35 and on signal line 36 to be approximately the same, resulting in very little energy being coupled to or from the signal line. Thus a minimum of added delay caused by coupling is observed. The signals I1, I2 and Si continue to propagate in stages 2 and 3, but layout mismatches destroy the in phase relationship established by the enabling of the latches 37, 38 and 39.

Continuing to refer to FIG. 3b, in mode 3 the signal Si is out of phase with the reference signals I1 and I2 for a positive transition going from a logical "0" to a logical "1". The input to LatchS is set to D1=1 and the inputs to Latch1 and Latch2 are set to In1=0 and In2=0. Latch1 and Latch2 are preset to a logical "1" and LatchS is reset prior to the latch enable signal, En, being applied. When the enable signal is applied, signals I1, I2 start at a logical "1" and Si starts at a logical "0". Signals I1 and I2 begin to make the transition together from a logical "1" to a logical "0" while the signal Si begins to make the transition from a logical "0" to a logical "1". This causes the instantaneous voltages on reference lines 34 and 35 to be out of phase with the signal on line 36 resulting in a maximum coupling of energy between the signal line 36 and the reference lines 34 and 35. Thus an added delay to the signal on line 36 caused by coupling is observed. In mode 4 the signal Si is out of phase with the reference signals I1 and I2 for a negative transition going from a logical "1" to a logical "0". The input to LatchS is set to D1=0 and the inputs to Latch1 and Latch2 are set to In1=1 and In2=1. Latch1 and Latch2 are reset and LatchS is preset to a logical "0" prior to the latch enable signal, En, being applied. When the enable signal is applied, signals I1, I2 start at a logical "0" and Si starts at a logical "1". Signals I1 and I2 begin to make the transition together from a logical "0" to a logical "1" while the signal Si begins to make the transition from a logical "1" to a logical "0". This causes the instantaneous voltages on reference lines 34 and 35 to be out of phase with the signal on line 36 resulting in a maximum coupling of energy between the signal line 36 and the reference lines 34 and 35. Thus an added delay to the signal on line 36 caused by coupling is observed. The signals I1, I2 and Si continue to propagate in stages 2 and 3, but layout mismatches destroy the out of phase relationship established by the enabling of the latches 37, 38 and 39.

Continuing to refer to FIG. 3b, the reference signals I1 and I2 are set and maintained at logical "0". This is called the quiescent ground mode. Either a positive transition or a negative transition is established on the signal line 36. Reference latches 37 and 38 are reset and the input signals In1 and In2 are set to a logical "0" to prevent any signal transition on the reference lines 34 and 35. For a signal transition from a logical "0" to a logical "1", LatchS 39 is reset with the input signal D1=1. For a signal transition from a logical "1" to a logical "0", LatchS 39 is preset to a logical 1 with the input signal D1=0. When the latch enable En signal is applied the signal Si begins to propagate through stage 1 then stage 2 and finally stage 3. The reference lines 34 and 35, 40 and 41, and 44 and 45 remain at a logical "0". Energy is coupled into the reference lines 34 and 35, 40 and 41, and 44 and 45 from the signal lines 36, 43 and 47 delaying the signal.

Continuing to refer to FIG. 3b, the reference signals I1 and I2 are set and maintained at a logical "1". This is called the quiescent VDD mode. Either a positive transition or a negative transition is established on the signal line 36. Reference latches 37 and 38 are preset to a logical "1" and the input signals In1 and In2 are set to a logical "1" to prevent any signal transition on the reference lines 34 and 35. For a signal transition from a logical "0" to a logical "1", LatchS 39 is reset with the input signal D1=1. For a signal transition from a logical "1" to a logical "0", LatchS 39 is preset to a logical 1 with the input signal D1=0. When the latch enable En signal is applied the signal Si begins to propagate through stage 1 then stage 2 and finally stage 3. The reference lines 34 and 35, 40 and 41, and 44 and 45 remain at a logical "1". Energy is coupled into the reference lines 34 and 35, 40 and 41, and 44 and 45 from the signal lines 36, 43 and 47 distorting delaying the signal.

Figure 4A:
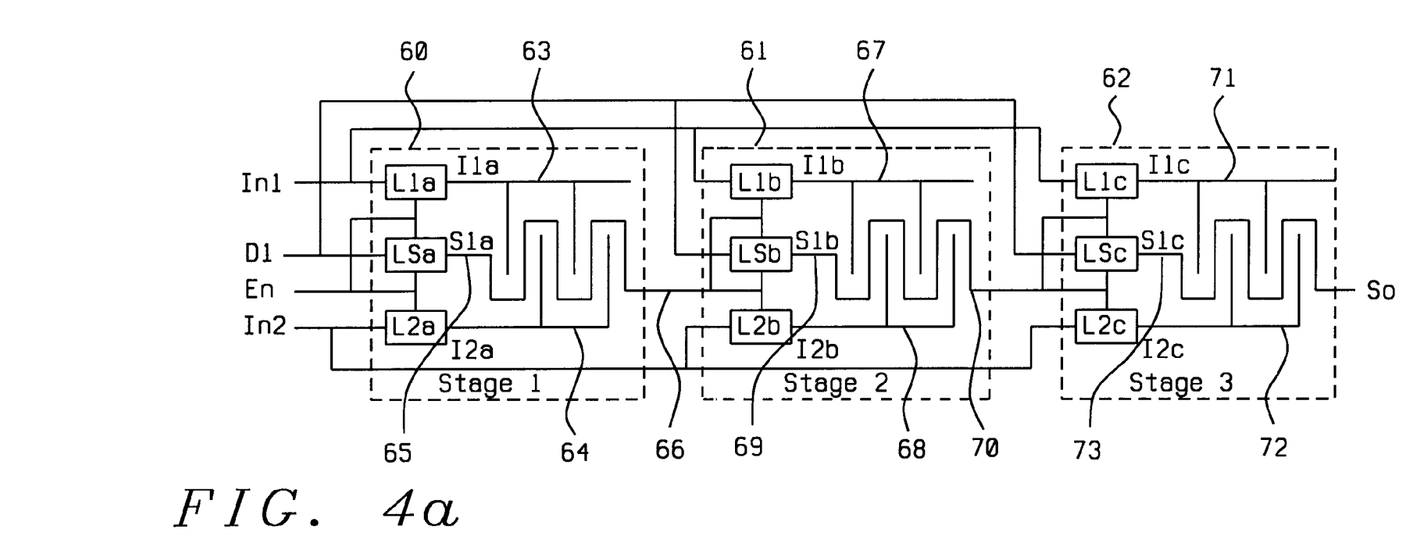

In FIG. 4a is shown a preferred embodiment of the present invention for a signal generator to delay a signal propagating through a wiring network with a positive transition going from a logical "0" to a logical "1". There are three stages 60, 61 and 62 concatenated together in series; although any number of stages can be concatenated together. The first stage 60 is driven by three latches, L1a, L2a and LSa. Latch L1a has a signal input In1, Latch L2a has a signal input In2 and latch LSa has a signal input D1. An enable signal En enables the latches so that the signals at the input In1, In2 and D1 of the latches are connected to output of the latches. The output signal of latch L1a is I1a which is connected to the first reference line 63 of the first stage 60. The output signal of latch L2a is I2a which is connected to the second reference line 64 of the first stage 60, and the output signal of latch LSa is S1a which is connected to the input of signal line 65 of the first stage 60. The output 66 of the signal line 65 is connected to the enable input to the latches L1b, L2b and LSb of the second stage 61 thereby maintaining the phase relationship between the reference signals I1b and I2b with the second stage signal S1b.

Continuing to refer to FIG. 4a, in the second stage 61 latch L1b is connected to the same input In1 as latch L1a in the first stage 60. Latch L2b is connected to the same input In2 as latch L2a in the first stage 60 and latch LSb is connected to the same input D1 as LSa. The output signal I1b of latch L1b is connected to the first reference line 67 of the second stage 61. The output signal I2b of latch L2b is connected to the second reference line 68 of the second stage 61, and the output signal S1b of latch LSb is connected to the input of the signal line 69 of the second stage 61. The output of the signal line 70 in the second stage is connected to the enable input to the latches L1c, L2c, and LSc of the third stage 62. The connections to the second and third stages 61 and 62 are similar to the first stage 60 and represent the connections that are made to any subsequent stage. Connecting the signal 66 and 70 from the previous stage to the enable input of the latches in the subsequent stage insures that the phase relationship between the signal S1b and reference signals I1b and I2b and between the signal S1c and the reference signals I1c and I2c are maintained. This produces a signal So at the output of the last stage represented by the third stage in FIG. 4a that demonstrates the delay effect the coupling mode in all stages.

Continuing to refer to FIG. 4a, in the third stage 62 latch L1c is connected to the same input In1 as latch L1a in the first stage 60. Latch L2c is connected to the same input In2 as latch L2a in the first stage 60 and signal latch LSc is connected to the same input D1 as LSa. The output signal I1c of latch L1c is connected to the first reference line 71 of the third stage 62. The output signal I2c of latch L2c is connected to the second reference line 72 of the third stage 62, and the output signal S1c of the signal latch LSc is connected to the input of the signal line 73 of the third stage 62. The output of the signal line So of the third stage is the output of the signal generator unless additional stages are connected, then the output of the signal line So is connected to the enable input to the latches the next stage 62.

Figure 4B:
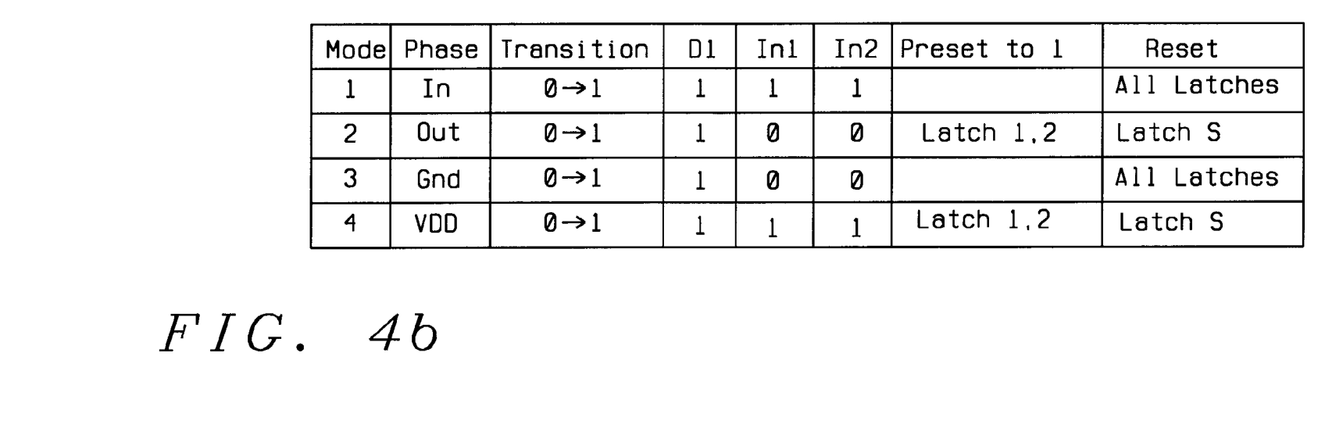
FIG. 4b is a table of operating conditions for the preferred implementation of the signal generator for a positive transition.

In FIG. 4b is a table of conditions for the circuit of FIG. 4a to allow four modes of coupling. In mode 1 the signals represented by S1a are in phase with the reference represented signals I1a, and I2a and the signal transition is positive, going from a logical "0" to a logical "1". All latches are reset to an output signal of a logical "0", and the inputs are set to D1=1, In1=1 and In2=1. The output of the latches switch simultaneous and all produce a positive transition. The instantaneous voltage at either end of the coupling capacitance is essentially the same producing no significant coupling of energy between the signal line 65 and the reference line 63 and 64 in the first stage, between the signal line 69 and the reference line 67 and 68 in the second stage, and between the signal line 73 and the reference line 71 and 72 in the third stage. In mode 2 the signal is out of phase with the signals on the reference lines. The transition of the signal is positive going from a logical "0" to a logical "1". At the same time the reference signals have a negative transition going from a logical "1" to a logical "0". To produce the out of phase relationship the latches represented by L1a and L2a are preset to a logical "1" and the signal latch represented by LSa is reset to an output of a logical "0". The enabling of the latches initiates reference signals represented by L1a and L2a that are out of phase with a positive going signal represented by S1a. At any instant of time except approximately the midpoint of the transition there is a voltage difference across the coupling capacitance which draws energy from the signal, distorts and delays the signal propagating on the signal wire.

Continuing to refer to FIG. 4b, the third mode is a quiescent mode using ground or a logical "0" as the voltage on the reference lines 60 and 64 in the first stage and representing the conditions in the subsequent stages. The signal transition S1a for this mode is positive going from a logical "0" to a logical "1". All latches are reset to a logical "0" and the input to the latches are set to D1=1, In1=0 and In2=0. When the latches are enabled by the enable signal the voltage on the reference lines 63 and 64 do not change and remain at a logical "0". The signal S1a goes through a positive transition from a logical "0" to a logical "1" and the signal S1a starts out coupling little energy into the reference lines 63 and 64 since the reference lines and the signal line are at approximately the same voltage. At the end of the signal transition a maximum energy is couple into the reference lines 63 and 64 from the signal line 65. This continues in the subsequent stages and the coupled energy from the signal line into the reference lines distorts and delays the signal. when the signal S1a exceeds the threshold of the latches in the subsequent stage, the latches in the subsequent stage are enabled and the quiescent mode continues in the next stage.

Continuing to refer to FIG. 4b, The fourth mode is a quiescent mode using a logical "1" as a reference signal. The inputs to the latches are set to D1=1, In1=1 and In2=1. the latches represented by L1a and L2a are preset to a logical "1" and the signal latch represented by LSa is reset. When the enable signal is applied the signal at the output of the signal latch represented by LSa produces a positive transition going from a logical "0" to a logical "1". Initially the voltage across the coupling capacitors is at approximately a maximum value and energy is couple to the reference lines represented by 63 and 64, delaying the signal represented by S1a on the signal line 65. As the transition is completed the voltage across the coupling capacitors is approximately zero and an insignificant amount of energy is coupled. In between the start and finish of the transition a varying amount of energy is coupled from the signal line represented by 65 and the reference lines represented by 63 and 64 and delaying the signal represented by S1a on line 65.

Figure 5A:
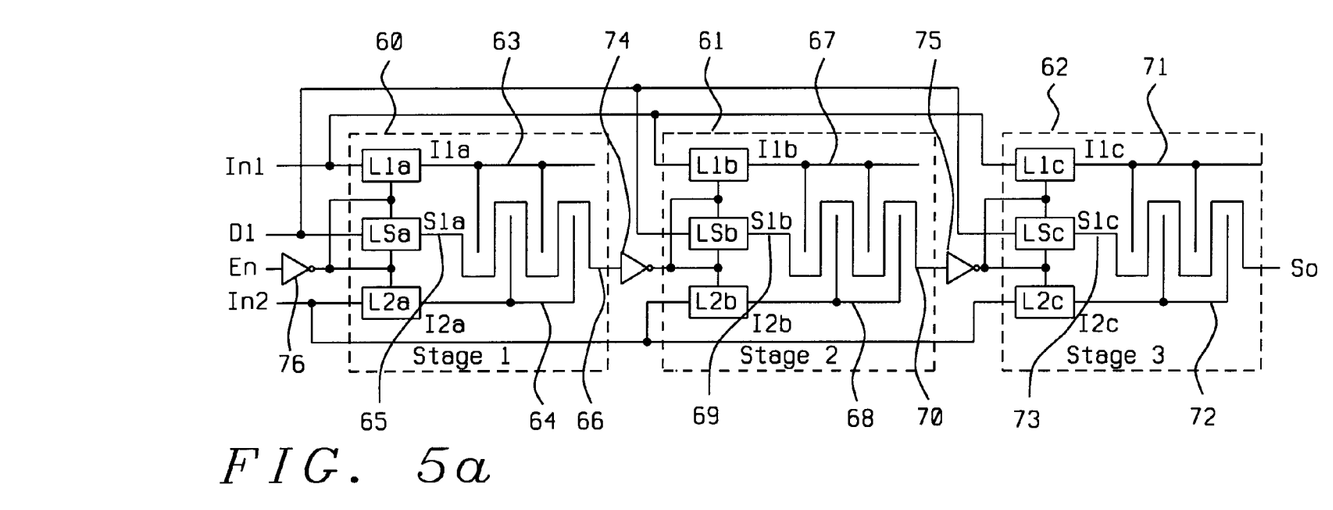
FIG. 5a shows the preferred implementation of the signal generator of the present invention for a negative transition.

In FIG. 5a is shown a preferred embodiment of the present invention for a signal generator to delay a signal propagating through a wiring network with a negative transition going from a logical "1" to a logical "0". There are three stages 60, 61 and 62 concatenated together in series; although any number of stages can be concatenated together. The first stage 60 is driven by three latches, L1a, L2a and LSa. Latch L1a has a signal input In1, Latch L2a has a signal input In2 and latch LSa has a signal input D1. An enable signal En is connected through an inverter circuit 76 to the latches L1a, L2a and LSa. The enable signal permits the signals at the input In1, In2 and D1 of the latches to be connected to output of the latches. The inverter 76 makes the first stage the same as the subsequent stages so that the design is modularized for convenience of design and layout. The output signal of latch L1a is I1a which is connected to the first reference line 63 of the first stage 60. The output signal of latch L2a is I2a which is connected to the second reference line 64 of the first stage 60, and the output signal of latch LSa is S1a which is connected to the input of signal line 65 of the first stage 60. The output 66 of the signal line 65 is connected through an inverter 74 to the enable input to the latches L1b, L2b and LSb of the second stage 61, allowing a signal with a negative transition to enable latches L1b, L2b and S1b, and thereby maintaining the phase relationship between the reference signals I1b and I2b with the second stage signal S1b.

Continuing to refer to FIG. 5a, in the second stage 61 latch L1b is connected to the same input In1 as latch L1a in the first stage 60. Latch L2b is connected to the same input In2 as latch L2a in the first stage 60 and latch LSb is connected to the same input D1 as LSa. The output signal I1b of latch L1b is connected to the first reference line 67 of the second stage 61. The output signal I2b of latch L2b is connected to the second reference line 68 of the second stage 61, and the output signal S1b of latch LSb is connected to the input of the signal line 69 of the second stage 61. The output of the signal line 70 in the second stage is connected through an inverter 75 to the enable input to the latches L1c, L2c, and LSc of the third stage 62. The connections to the second and third stages 61 and 62 are similar to the first stage 60 and represent the connections that are made to any subsequent stage. Connecting the signal 66 and 70 from the previous stage to the enable input of the latches through an inverter 74 and 75 in the subsequent stage insures that the phase relationship between the signal S1b and reference signals I1b and I2b and between the signal S1c and the reference signals I1c and I2c are maintained. This produces a signal So at the output of the last stage represented by the third stage in FIG. 4a that demonstrates the delay effect the coupling mode in all stages.

Continuing to refer to FIG. 5a, in the third stage 62 latch L1c is connected to the same input In1 as latch L1a in the first stage 60. Latch L2c is connected to the same input In2 as latch L2a in the first stage 60 and signal latch LSc is connected to the same input D1 as LSa. The output signal I1c of latch L1c is connected to the first reference line 71 of the third stage 62. The output signal I2c of latch L2c is connected to the second reference line 72 of the third stage 62, and the output signal S1c of the signal latch LSc is connected to the input of the signal line 73 of the third stage 62. The output of the signal line So of the third stage is the output of the signal generator unless additional stages are connected, then the output of the signal line So is connected to the enable input to the latches the next stage through an inverter circuit.

Figure 5B:
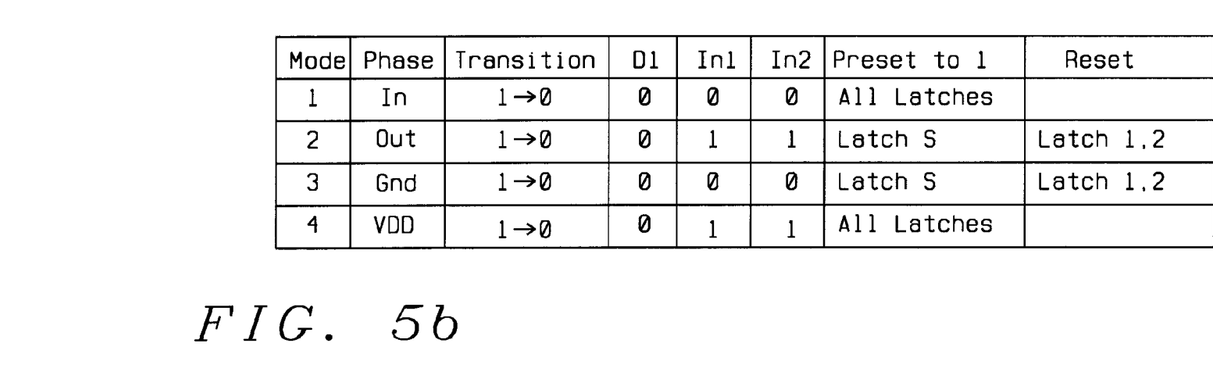
FIG. 5b is a table of the operating conditions for the preferred implementation of the signal generator for a negative transition.

In FIG. 5b is a table of conditions for the circuit of FIG. 4a to allow four modes of coupling for a negative transition. In mode 1 the signals represented by S1a are in phase with the reference represented signals I1a, and I2a and the signal transition is negative, going from a logical "1" to a logical "0". All latches are preset to an output signal of a logical "1", and the inputs are set to D1=0, In1=0 and In2=0. The output of the latches switch simultaneous and all produce a negative transition. The instantaneous voltage at either end of the coupling capacitance is essentially the same throughout the transition and producing no significant coupling of energy between the signal line 65 and the reference line 63 and 64 in the first stage, between the signal line 69 and the reference line 67 and 68 in the second stage, and between the signal line 73 and the reference line 71 and 72 in the third stage. In mode 2 the signal is out of phase with the signals on the reference lines. The transition of the signal is negative going from a logical "1" to a logical "0". At the same time the reference signals have a positive transition going from a logical "0" to a logical "1". To produce the out of phase relationship the latches represented by L1a and L2a are reset to a logical "0" and the signal latch represented by LSa is preset to an output of a logical "1". The enabling of the latches initiates reference signals represented by L1a and L2a that are out of phase with a negative going signal represented by S1a. At any instant of time except approximately the midpoint of the transition there is a voltage difference across the coupling capacitance which draws energy from the signal, distorts and delays the signal propagating on the signal wire.

Continuing to refer to FIG. 5b, the third mode is a quiescent mode using ground or a logical "0" as the voltage on the reference lines 63 and 64 in the first stage and representing the conditions in the subsequent stages. The signal transition S1a for this mode is negative going from a logical "1" to a logical "0". Latches represented by L1a and L2a are reset to a logical "0" and the signal latch represented by LSa is preset to a logical "1". The input to the latches are set to D1=0, In1=0 and In2=0. When the latches are enabled by the enable signal, the voltage on the reference lines 63 and 64 do not change and remain at a logical "0". The signal S1a goes through a negative transition from a logical "1" to a logical "0" and the signal S1a starts out coupling energy into the reference lines 63 and 64 since the reference lines are at a different voltage than the signal line. At the end of the signal transition a minimum amount of energy is couple into the reference lines 63 and 64 from the signal line 65 since the signal line and the reference lines are at approximately the same voltage. This continues in the subsequent stages and the coupled energy from the signal line into the reference lines distorts and delays the signal. When the signal S1a is inverted 74 and goes above the threshold of the latches in the subsequent stage, the latches in the subsequent stage are enabled and the quiescent mode continues in the next stage.

Continuing to refer to FIG. 5b, The fourth mode is a quiescent mode using a logical "1" as a reference signal. The inputs to the latches are set to D1=0, In1=1 and In2=1. All latches represented by L1a, L2a and LSa are preset to a logical "1". When the enable signal is applied, the signal at the output of the signal latch represented by LSa produces a negative transition going from a logical "1" to a logical "0". Initially the voltage across the coupling capacitors is at approximately he same value and little energy is couple to the reference lines represented by 63 and 64. As the transition is completed the voltage across the coupling capacitors is approximately at a maximum and energy is coupled between the signal line and the reference lines. In between the start and finish of the transition a varying amount of energy is coupled from the signal line represented by 65 and the reference lines represented by 63 and 64 and thus delaying the signal represented by S1a on line 65.

While the invention has been particularly shown and described with reference to preferred embodiments thereof, it will be understood by those skilled in the art that various changes in form and details may be made without departing from the spirit and scope of the invention.

What is claimed is:

1. A signal delay circuit, comprising:
   a first delay stage,
   a data input to said first stage connected to a first latch of said first stage,
   a first reference signal connected to input of a second latch of said first stage,
   a second reference signal connected to input of a third latch of said first stage,
   an enable signal connected to said first, second and third latch of said first stage,
   a first wire connected to an output of said first latch of said first stage,
   a second wire adjacent to said first wire connected to an output of said second latch of said first stage,
   a third wire adjacent to said first wire connected to an output of said third latch of said first stage,
   said second and third wire coupled by means of capacitance to said first wire and thereby delaying a first signal at an output end of said first wire by coupling a second signal from the second wire and a third signal from the third wire,
   a second delay stage configured in similar fashion to said first delay stage,
   said delayed signal in said first wire connected to an enable signal for said second stage,
   said data input connected to a first latch of said second stage,
   said first reference signal connected to input of a second latch of said second stage, and
   said second reference signal connected to input of a third latch of said second stage.

2. The circuit of claim 1, wherein additional stages are concatenated in series to said second stage in a like manner to the second stage connected to said first stage.

3. The circuit of claim 2, further comprising an inverter circuit to invert said enable signal, wherein said inverter circuit is used for negative signal transitions to allow said negative signal transitions to enable latches in each stage of delay.

4. The circuit of claim 3, wherein an in phase delayed signal with a negative transition is produced by first setting an output of the first, second and third latches in each stage to a logical "1", then setting said data input, said first reference signal and said second reference signal to a logical "0", and then applying said enable signal.

5. The circuit of claim 3, where in an out of phase delayed signal with a negative transition is produce by first setting an output of said first latch in each stage to a logical "1", then resetting said second and said third latch in each stage to a logical "0", then setting data input to a logical "0", then setting said first and second reference signal s to a logical "1", an d then applying said enable signal.

6. The claim of claim 3, wherein a quiescence ground phase delayed signal with a negative transition is produce by first setting an output of said first latch in each stage to a logical "1", then resetting said second and said third latch in each stage to a logical "0", then setting data input to a logical "0", then setting said first and second reference signals to a logical "0", and then applying said enable signal.

7. The claim of claim 3, wherein a quiescence VDD phase delayed signal with a negative transition is produce by first setting an output of the first, second and third latches in each stage to a logical "1, then setting data input to a logical "0", then setting said first and second reference signals to a logical "1", and then applying said enable signal.

8. The circuit of claim 2, wherein an in phase delayed signal with a positive transition is produced by resetting all latches to a logical "0", then setting said data input, said first reference signal and said second reference signal to a logical "1", and then applying said enable signal.

9. The circuit of claim 2, wherein an out of phase delayed signal with a positive transition is produced by setting said second and third latch in each stage to a logical "1", then resetting said first latch in each stage to a logical "0", then setting data input to a logical "1" and setting said first and second reference signals to a logical "0", and then applying said enable signal.

10. The circuit of claim 2, wherein a quiescence ground phase delayed signal with a positive transition is produced by resetting all latch in each stage to a logical "0", then setting data input to a logical "1", then setting said first and second reference signals to a logical "0", and then applying said enable signal.

11. The claim of claim 2, wherein a quiescence VDD phase delayed signal with a positive transition is produced by setting said second and third latches in each stage to a logical "1, then resetting said first latch in each stage to a logical "0", then setting data input to a logical "1", then setting said first and second reference signals to a logical "1", and then applying said enable signal.

12. A wire coupling capacitance delay means, comprising:
    a means for coupling a plurality reference signals on a plurality of reference wires to a signal on a signal wire to delay said signal on said signal wire,
    a means for applying said reference signals to said reference wires to produce the delayed signal,
    an enabling means for synchronizing said reference signals with said signal,
    a concatenating means for connecting together a plurality of stages where each stage comprises said signal wire and said plurality of reference wires.

13. The delay means of claim 12, wherein a means for inverting said signal is used to enable latches in a stage of delay when said delayed signal has a negative transition.

14. The delay means of claim 12, wherein the means to couple said reference signals to said signal requires a wiring layout to route said reference wires and said signal wire on a same wiring plane.

15. The delay means of claim 12, wherein the means to couple said reference signals to said signal requires a wiring layout to route said signal wire on a first wiring plane and said reference wires on a second wiring plane over an area of location of said signal wire.

16. A method for controlling a delay of a signal propagating in a printed wire, comprising:

a) connecting a first reference data to a first reference wire using a first reference latch, b) connecting a second reference data to a second reference wire using a second reference latch, c) connecting input data to a signal wire using a signal latch, d) enabling said first and second reference latches and said data latch with an enable signal, e) selecting a coupling mode by resetting and presetting said first and second reference latches and said signal latch and selecting data input to said first and second reference latches and said signal latch, f) delaying a signal on said signal wire by a coupling of energy to said first and second reference wires.

17. A method for controlling a delay of a signal propagating in a printed wire, comprising:

a) connecting a first reference data to a first reference wire using a first reference latch, b) connecting a second reference data to a second reference wire using a second reference latch, c) connecting input data to a signal wire using a signal latch, d) enabling said first and second reference latches and said data latch with an enable signal, e) selecting a coupling mode by resetting and presetting said first and second reference latches and said signal latch and selecting data input to said first and second reference latches and said signal latch f) delaying a signal on said signal wire by a coupling of energy to said first and second reference wires.

g) concatenating a second stage of delay to a first stage of signal delay by connecting an output of said signal wire of said first stage of signal delay to latch enable of said second and connecting said first and second reference wires of said first stage of signal delay to an input of said first and second reference latches of said second stage of signal delay.

18. The method of claim 17, wherein a signal with a negative transition at said output of said signal wire in said first stage is inverted to enable said first and second reference latches and said signal latch in said second stage of signal delay.

19. The method of claim 16, wherein said first and second reference wires are routed adjacent to said signal wire on a same wiring plane.

20. The method of claim 16, wherein said signal wire is routed on a first wiring plane and said first and second reference wires are routed on a second wiring plane over an area of location of said signal wire.

* * * * *